United States Patent [19]

Jacobs et al.

[11] 4,306,353

[45] Dec. 22, 1981

[54] PROCESS FOR PRODUCTION OF INTEGRATED MOS CIRCUITS WITH AND WITHOUT MNOS MEMORY TRANSISTORS IN SILICON-GATE TECHNOLOGY

[75] Inventors: Erwin Jacobs, Vaterstetten; Ulrich Schwabe, Munich, both of Fed. Rep. of Germany

[73] Assignee: Siemens Aktiengesellschaft, Berlin & Munich, Fed. Rep. of Germany

[21] Appl. No.: 154,316

[22] Filed: May 29, 1980

[30] Foreign Application Priority Data

Jun. 13, 1979 [DE] Fed. Rep. of Germany ....... 2923995

[51] Int. Cl.³ .......................................... H01L 21/26
[52] U.S. Cl. ................................... 29/571; 29/576 B; 148/1.5; 148/187; 357/23
[58] Field of Search ............... 29/571, 576 B; 148/1.5, 148/187; 357/23

[56] References Cited

U.S. PATENT DOCUMENTS

| | | | |
|---|---|---|---|
| 3,798,752 | 3/1974 | Fujimoto | 29/571 |
| 3,967,981 | 7/1976 | Yamazaki | 148/1.5 |
| 3,986,903 | 10/1976 | Watrous | 148/187 |
| 4,035,198 | 7/1977 | Dennard et al. | 148/1.5 |
| 4,101,921 | 7/1978 | Shimada et al. | 357/23 |
| 4,113,533 | 9/1978 | Okumura et al. | 29/571 X |
| 4,149,307 | 4/1979 | Henderson | 29/571 |
| 4,170,500 | 10/1979 | Crossley | 148/187 |
| 4,179,311 | 12/1979 | Athanas | 148/1.5 |
| 4,198,252 | 4/1980 | Hsu | 148/187 |
| 4,221,045 | 9/1980 | Godejahn | 29/571 |
| 4,229,755 | 10/1980 | Custode | 29/571 X |
| 4,257,832 | 3/1981 | Schwabe et al. | 148/187 |
| 4,264,376 | 4/1981 | Yatsuda et al. | 148/1.5 |
| 4,268,328 | 5/1981 | Hsia | 148/187 |

FOREIGN PATENT DOCUMENTS 2509315 9/1975 Fed. Rep. of Germany .
2723374 1/1978 Fed. Rep. of Germany .

OTHER PUBLICATIONS

Oldham et al., "Improved Integrated Circuit Contact Geometry Using Local Oxidation," Proceedings of Electrochem. Soc., Abst. 277, May 1978, pp. 690–691.
Rideout et al., "A One-Device Memory Cell Using a Single Layer of Polysilicon and a Self-Registering Metal-To-Polysilicon Contact, 38 Int. Electron Devices Meeting, Technical Digest, Wash. D.C., Dec. 1977, pp. 258–261.

Primary Examiner—G. Ozaki
Attorney, Agent, or Firm—Hill, Van Santen, Steadman, Chiara & Simpson

[57] ABSTRACT

Integrated MOS circuits with and without MNOS memory transistors in silicon-gate technology are produced with overlapped contacts using a silicon nitride mask. After production of structured SiO₂ layers on a p- or n- doped semiconductor substrate to separate active transistor zones in accordance with the so-called LOCOS process, a silicon nitride layer is deposited onto the surface and is then structured so that the zones in which a gate oxide is to be produced, are uncovered and during gate oxidation, the surface of this structured silicon nitride layer is converted into an oxynitride layer. In contrast to previously known processes, the invention provides self-aligned overlapped contacts with oversized contact holes. The silicon-nitride layer functions as an etch-stop during etching of an intermediate oxide. This avoids under-etching of the polysilicon during contact hole etching. The overlapped contacts allow a substantial increase in the packing and integration density of the so-produced circuits.

6 Claims, 12 Drawing Figures

PROCESS FOR PRODUCTION OF INTEGRATED MOS CIRCUITS WITH AND WITHOUT MNOS MEMORY TRANSISTORS IN SILICON-GATE TECHNOLOGY

BACKGROUND OF THE INVENTION

1. Field of the Invention

The invention relates to a process of producing integrated MOS circuits and somewhat more particularly to producing integrated MOS circuits with and without MNOS memory transistors constructed in silicon-gate technology and provided with overlapping contacts, using a silicon nitride mask.

2. Prior Art

One of the most important goals in production of highly integrated semiconductor circuits is to accommodate as many circuit components (i.e., transistors) or functional units as possible per unit area, on a basis of a minimum, controllable structure size. The inactive regions of a circuit, i.e., those regions which do not directly contribute to the circuit function, are particularly troublesome in achieving such goals. Such inactive regions include the non-utilizable zones at the periphery of contact holes. These inactive zones result from requisite safety spacings.

Currently, polysilicon technology is mainly used for production of MOS components. In this technology, the gate electrodes of field effect transistors and conductor leads or interconnections which function to connect such electrodes are formed from polysilicon. The main advantage of this technology, in contrast to a technology wherein such electrodes and conductor leads are composed of aluminum, is that the disturbing gate-source and gate-drain overlap capacitances can be kept very small and the polysilicon forms an additional level of interconnection.

In n-channel and p-channel silicon and double silicon-gate technology, it is necessary to produce contact holes in $SiO_2$ layers, both on $n^+$- and $p^+$-doped monocrystalline silicon zones as well as $n^+$- and $p^+$-doped polycrystalline zones. It is also necessary to insure that part of the area of a contact hole does not project beyond the zone which is to be contacted, since otherwise a danger exists that the metallic conductor lead which is later applied over such contact hole can produce a short-circuit to an adjacent p- or n-doped zone of a monocrystalline silicon substrate. In the event that a contact hole projects beyond a polysilicon structure, there is also a danger that underetching of $SiO_2$, under the polysilicon structure, can produce an overhang of the polysilicon structure, which can cause an interruption of the overlying conductor lead.

In order to prevent contact holes from projecting beyond these zones which are to be contacted, it is necessary to provide safety spacings between the edges of the contact holes and the edges of the adjacent doped silicon zones. Such safety spacings are necessary because the distance between two structure edges in two different levels cannot be attained with arbitrary accuracy but only within a specific tolerance range, which with present prior art technology, is about $\pm 2$ $\mu m$.

The prior art is aware of various means of minimizing or rendering unnecessary the earlier described safety spacings at peripheries of contact holes.

German Offenlegungsschrift (hereinafter DE-OS) No. 27 23 374 describes a process wherein the oxidation-inhibiting effect and the etch-stop effect of nitride layers are exploited to provide contact holes having base areas which project beyond the polysilicon zones which are to be contacted. However, this process requires an additional contact hole mask; safety spacings must still be provided at the peripheries of contact holes between monocrystalline $n^+$- and $p^+$- doped zones and the metallic interconnections or leads; and the slopes of the contact holes are extremely steep or even overhanging.

V. L. Rideout et al, "A One-Device Memory Cell Using a Single Layer of Polysilicon and a Self-Registering Metal-to-Polysilicon Contact", International Electron Devices Meeting, Technical Digest, Washington, U.S.A., page 258 (December 1977) suggests that a those points at which contact holes are to be formed, the polysilicon layer can be covered by a double layer of silicon dioxide. Those portions of the polysilicon layer which are not covered, are etched away. This procedure also involves the disadvantages of the process described in DE-OS No. 27 23 374, with the difference that the slopes of the resultant polysilicon structure (and not of the contact holes) are overhanging.

W. G. Oldham et al, "Improved Integrated Circuit Contact Geometry Using Local Oxidation", Electrochemical Society Spring Meeting, Seattle, U.S.A., page 960 (May 1978) suggests that an oxidation-inhibiting silicon nitride layer be applied after etching of the polysilicon layer. This nitride layer is then etched in such a manner that it only remains at the points where contact holes are to be formed. A disadvantage of this process is that the slopes of the resultant polysilicon structures can overhang and in instances where contact holes are arranged partially or completely on gate zones, the earlier described safety spacings from the polysilicon edges are still required.

A process which minimizes or renders superfluous the safety spacings at peripheries of contact holes between monocrystalline $n^+$-doped zones and metallic interconnections is disclosed in DE-OS No. 25 09 315. In this process, after etching of the contact holes, a dopant (phosphorus or arsenic) is introduced into the contact hole walls. With this measure, in the event of projecting contact holes, a short-circuit between monocrystalline $n^+$-zones and adjacent p-doped zones is prevented. However, this process still requires safety spacings at peripheries of contact holes adjacent to polysilicon structures.

SUMMARY OF THE INVENTION

The inventive process was developed with goals of producing an MOS circuit in silicon-gate technology whereby:

1. Safety spacings become unnecessary so that a large packing density of circuit components per unit is achieved;
2. Short circuits between metallic interconnections, which are applied above a contact hole and adjacent doped zones produced in a silicon substrate, are avoided;
3. The surface of the ultimate integrated semiconductor circuit is as level as possible and does not contain any steep steps; and
4. MOS transistors and MNOS memory transistors are produced, when desired, simultaneously.

In accordance with the principles of the invention, the above goals are attained by producing structure $SiO_2$ layers on a p- or n- doped semiconductor substrate so as to separate active transistor zones via the so-called LOCOS or isoplanar process, thereafter depositing a silicon nitride layer onto the entire surface and then structuring this nitride layer in such a manner that those zones in which a gate-oxide is to be produced, are uncovered and oxidizing the so-uncovered zones to produce gate oxidation while substantially simultaneously converting the surface of the remaining silicon nitride layer into an oxynitride layer.

In certain embodiments of the invention, a channel ion implantation is carried out through the silicon nitride layer, which has been applied to the entire device surface and before etching thereof.

A specific exemplary embodiment of the principles of the invention for producing an integrated n-channel or p-channel MOS circuit including MNOS memory transistors, comprises a combination of the following process steps:

(a) producing structured SiO$_2$ layers on a p- or n-doped semiconductor substrate in order to separate active transistor zones in accordance with the so-called LOCOS or isoplanar techniques;

(b) producing a first SiO$_2$ layer on the entire surface, which layer functions as a tunnel oxide;

(c) depositing a silicon nitride layer over the entire surface;

(d) executing a channel ion implantation;

(e) etching the silicon nitride layer so as to produce nitride-covered zones (and uncover substrate zones in which gate oxidation is to be produced);

(f) oxidizing the uncovered p- or n-substrate surfaces to form gate oxides and substantially simultaneously converting the surface of the structured silicon nitride layer into an oxynitride layer;

(g) producing a n+- or p+-doped polysilicon layer on the entire surface and then structuring such polysilicon layer;

(h) executing an ion implantation step so as to produce monocrystalline n+- or p+-doped source zones and drain zones respectively, in the p-doped or n-doped silicon substrate;

(i) oxidizing the structured polysilicon layer so that it is partially converted into a SiO$_2$ layer;

(j) producing a second SiO$_2$ layer on the entire substrate, which layer functions as an intermediate oxide;

(k) etching contact holes to form contacts between monocrystalline n+- or p+-doped zones, polysilicon zones and metallic interconnections; and (1) producing requisite metallic interconnections.

In a manner similar to that described for the Si-gate process, a double Si-gate process (sometimes referred to as a Si$^2$-gate process) can also be utilized in the practice of the invention. IN such instances, during the above-described process step (e) the gate zones for the transistors can also be opened and after process step (i), a polysilicon-II layer is produced in a known manner. Step (h) is then carried out, after structuring of the poly-Si-II layer, immediately prior to the production of the intermediate oxide [i.e., step (j)].

In contrast to the known silicon-gate process, the process in accordance with the principles of the invention allows the use of self-aligned, overlapped contacts having an oversized contact hole. During etching of the intermediate oxide, the silicon-nitride functions as an etch-stop; with polysilicon contacts, this avoids undesired underetching of polysilicon. Further, with the source and drain contacts, the nitride etch-stop prevents fracturing or the like at the thick-oxide edge and thus avoids a metal-substrate short circuit. With the practice of the invention, the contact between polysilicon and n+- or p+-diffused zones is considerably smaller in area than with a buried contact (which is technologically difficult to achieve and which also necessitates the use of an additional mask). The overlapped contact attained with the inventive process, results in a substantial increase in circuit packing and integration density. A further advantage of the invention is that both MOS-transistors and MNOS memory-transistors can be produced simultaneously.

DESCRIPTION OF THE PREFERRED EMBODIMENTS

Figure 1:
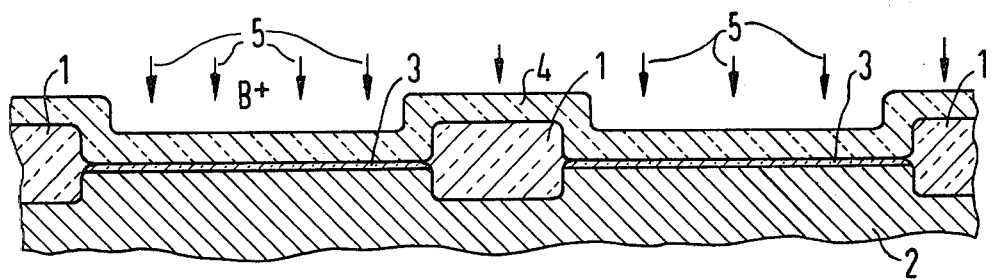
FIGS. 1–6 are elevated, partial, cross-sectional and somewhat schematic views of a device undergoing a fabrication sequence in accordance with the principles of the invention, as applied to n-channel-MOS technology.

The inventive process as applied via silicon-gate procedures in n-channel-MOS technology including a silicon nitride insulator and overlapped contacts, occurs, for example, as follows:

(a) Structured SiO$_2$ layers 1 (so-called field oxide zones, which are approximately 0.7 μm thick) are produced on a p-doped (2 to 200 Ωcm) semiconductor substrate, composed of a <100>-orientated silicon. This is accomplished via the so-called LOCOS process wherein a structured nitride layer is applied, a field ion implanatation step is executed and thereafter a structured SiO$_2$ layer is produced. This LOCOS process is concluded by removal of the nitride layer. The individual LOCOS process steps have not been shown in the drawing.

(b) Next, a SiO$_2$ layer 3 (FIG. 1), with a thickness of about 3 nm is produced on the entire free surface of the silicon substrate 2, which is partially covered with the structure SiO$_2$ layers 1 thereon. The relatively thin oxide layer 3 functions as a tunnel oxide.

(c) Then, as shown further at FIG. 1, a silicon nitride layer 4 is deposited over the entire device surface in a thickness of about 25 to 40 nm, and (d) a channel ion implantation step using boron (B+) is executed, as schematically indicated by arrows 5 in FIG. 1.

Figure 2:
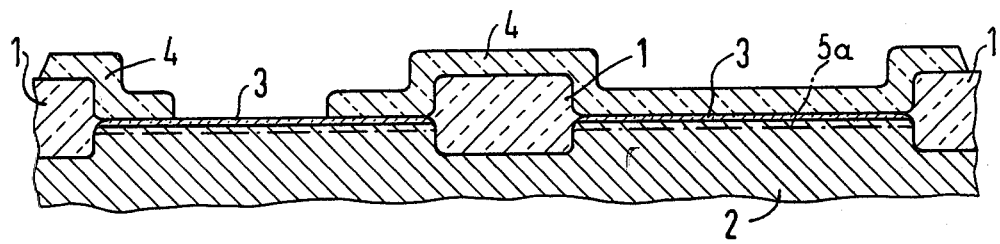

(e) FIG. 2 illustrates structuring or etching of the silicon nitride layer 4 so as to produce nitride-covered substrate zones while substantially simultaneously opening gate zones for the ultimately produced polysilicon transistors. The dash-dot line 5a schematically shows the channel doping (enhancement implantation).

Figure 3:
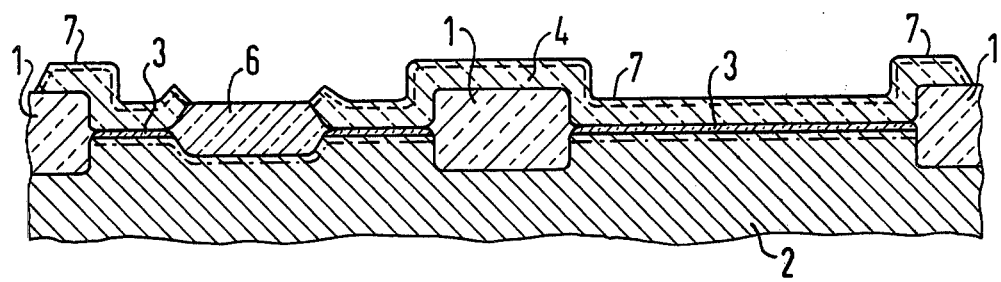

(f) During gate oxidation illustrated in FIG. 3, the uncovered surfaces of the p-doped substrate 2 are oxidized to form a gate oxide 6 in a layer thickness of about 50 nm; substantially simultaneously, the surface of the structured silicon nitride layer 4 is converted into an oxynitride layer 7 having a thickness of about 10 nm.

Figure 4:
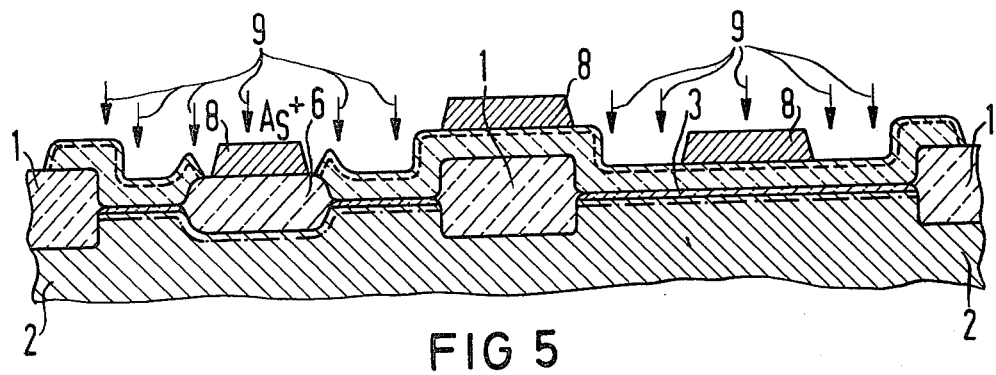

(g) FIG. 4 schematically indicates the deposition of 500 nm thick n+-doped polysilicon layer 8 via the CVD (chemical vapor deposition) process and the structuring thereof; and (h) illustrates the execution of an arsenic ion (As+) implantation step (arrows 9) so as to produce monocrystalline n+-doped source and drain zones 10 (best seen in FIG. 5) in the p-doped silicon substrate 2.

Figure 5:
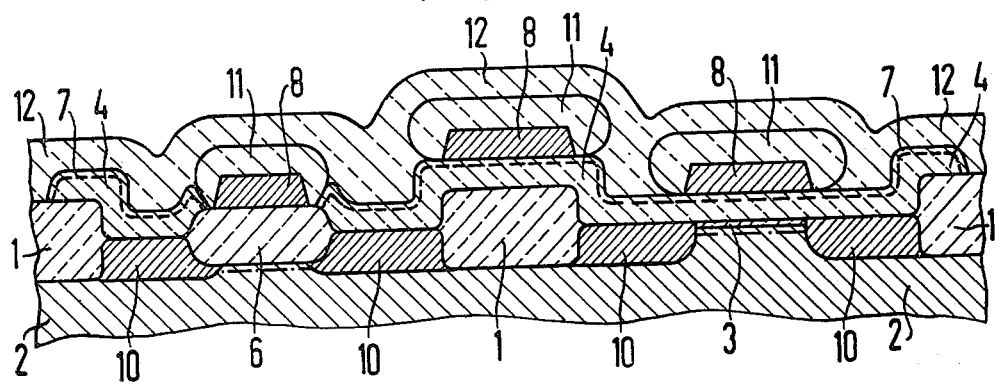

(i) Then, as shown in FIG. 5, the structured polysilicon layer 8 is oxidized to encompass zone 11 and a silicon oxide layer 12, which functions as an intermediate oxide, is deposited over the entire device surface via the CVD process in a layer thickness of about 500 nm.

Figure 6:
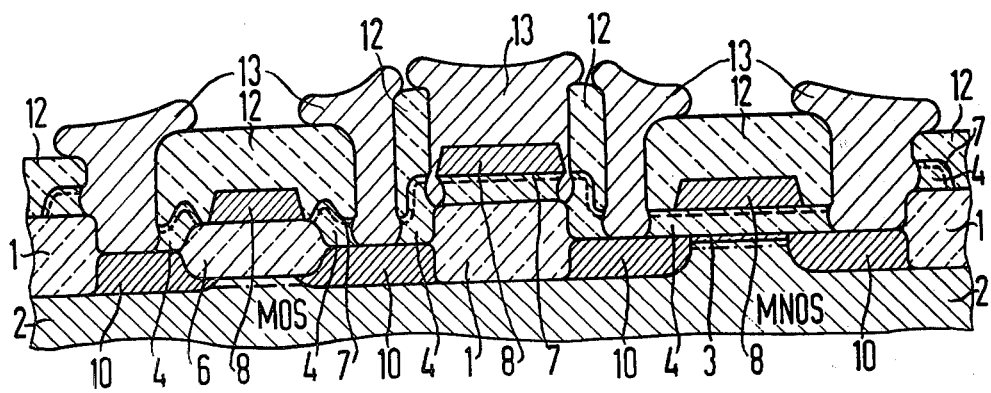

(k) FIG. 6 shows the production of contact holes for formation of contacts between the monocrystalline n+-zones 10, the polysilicon zones 8 and the metallic interconnections 13 and also illustrates the production of the metallic interconnections 13.

As can be seen from FIG. 6, during etching of the intermediate oxide 12, the silicon nitride layer 4 has functioned as an etch-stop so that no underetching occurred. Oxide etching (tunnel oxide 3) in the production of contact holes is only required when MNOS memory transistors are to be produced.

Finally, the overall device is provided with a protective coating in a known manner so that this step has not been illustrated.

Figure 8:
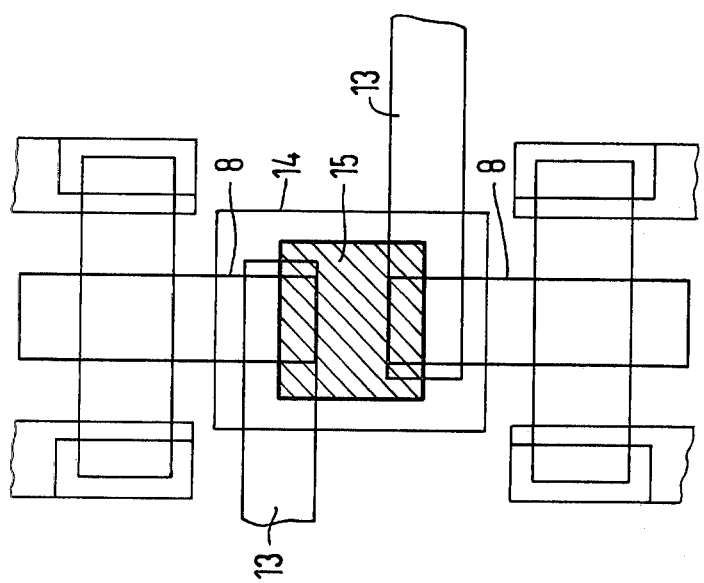
FIGS. 7–12 are somewhat schematic plan views on a scale of 2000:1 illustrating the saving of space achieved in a circuit having overlapped contacts produced via the principles of the invention (FIGS. 8, 10 and 12) in contrast to similar circuits having prior art contacts (FIGS. 7, 9, and 11).
Figure 7:
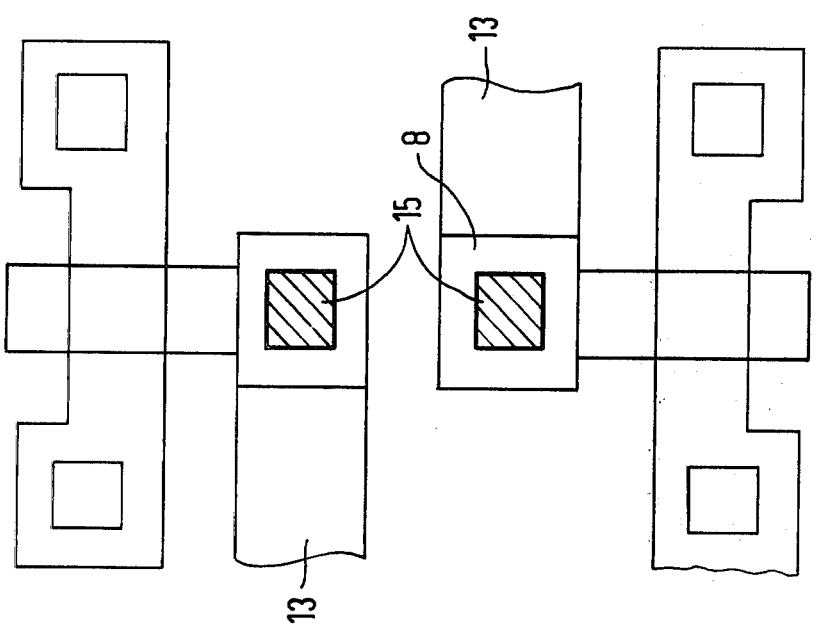

In plan view and on a scale of 2000:1, FIGS. 7 and 8 show a comparison of the space requirements of conventional contacts and those of self-aligned overlapped contacts in a gate zone attained via the practice of the invention. The shaded zone 15 schematically indicates the respective contact holes and the nitride mask is shown by line 14. Otherwise, the various components are referenced with identical reference numerals used in conjunction with the discussion of FIGS. 1-6.

Figure 10:
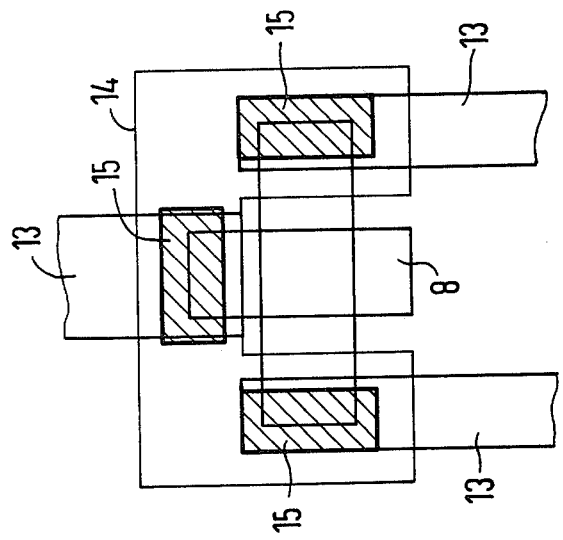
Figure 9:
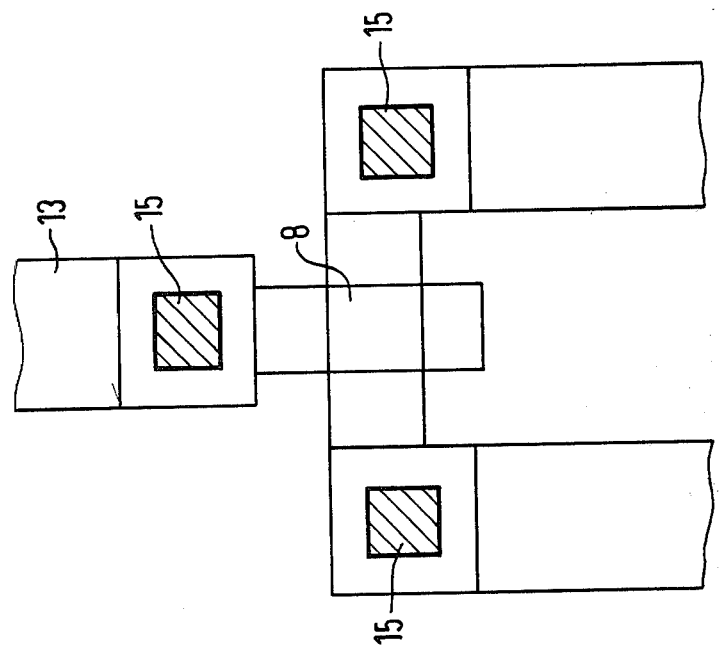

Again, in plan view and on a scale of 2000:1, FIG. 9 and FIG. 10 illustrate a comparison between the space requirements of conventional contacts and those of self-aligned, overlapped contacts (source-, drain- and gate contacts). In these illustrations, the same reference numerals utilized in the earlier drawings are used to indicate identical components.

Figure 12:
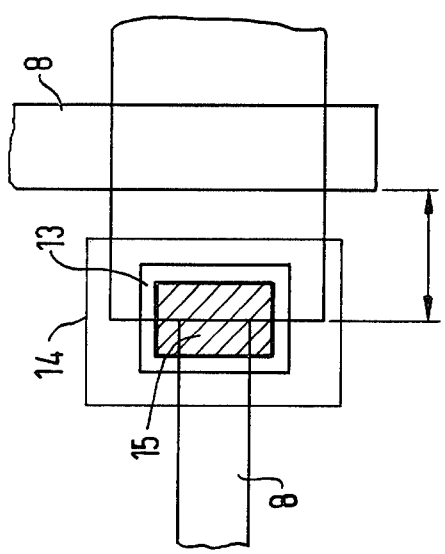
Figure 11:
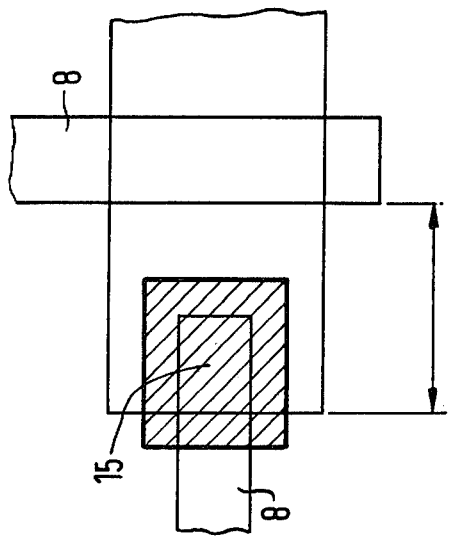

FIGS. 11 and 12 illustrate, in plan view and on a scale of 2000:1, a comparison of contacts between polysilicon and n+-diffused zones, with FIG. 11 showing a prior art buried contact, which requires the use of an additional mask, and FIG. 12 showing an overlapped contact produced in accordance with the principles of the invention. Again, the same reference numerals utilized in the earlier drawings are used to indicate identical components.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In the process for producing integrated MOS circuits with and without MNOS memory transistors in silicongate technology, and having overlapped contacts using a silicon nitride mask, the improvement comprising:

after producing structured SiO$_2$ layers on a p- or n-doped semiconductor substrate so as to separate active transistor zones in accordance with the so-called LOCOS or isoplanar process, depositing a silicon nitride layer on the entire structure surface and structuring such nitride layer in such a manner that those zones in which gate oxides are to be produced are uncovered, and during a gate oxidation, converting the surface of such structured nitride layer into an oxynitride layer.

2. In a process as defined in claim 1 wherein a channel ion implanation step is executed, after deposition of such silicon nitride layer on the entire structure surface, through such silicon nitride layer.

3. A process for producing integrated n-channel and p-channel MOS circuits with and without MNOS memory transistors in silicon-gate technology and having overlapped contacts using a silicon nitride mask, comprising a sequential combination of steps:

(a) producing structured SiO$_2$ layers on a p- or n-doped semiconductor substrate so as to separate active transistor zones in accordance with the so-called LOCOS or isoplanar process;

(b) producing a first SiO$_2$ layer (tunnel oxide) over the entire device surface;

(c) depositing a silicon nitride layer over the entire device surface;

(d) executing a channel ion implantation;

(e) etching said silicon nitride layer so as to produce select nitride-covered substrate zones;

(f) executing a gate oxidation step by oxidizing the uncovered n- or p-doped substrate surface and substantially simultaneously oxidizing the surface of said structured silicon nitride layer to form an oxynitride layer;

(g) depositing a n+- or p+-doped polysilicon layer over the entire surface and structuring the polysilicon layer in a predetermined manner;

(h) executing an ion implantation step so as to produce monocrystalline n+- or p+-doped source and drain zones in said p- or n- doped substrate;

(i) oxidizing said structured polysilicon layer to form an SiO$_2$ layer;

(j) producing a second SiO$_2$ layer (intermediate oxide) onto the entire device surface;

(k) etching contact holes so as to form contacts between n+- or p+-doped zones, polysilicon zones and metallic interconnections, respectively, and (l) producing a select pattern of metallic interconnections.

4. A process as defined in claim 3 wherein said process is executed in a Si$^2$-gate technology and during step (e) gate zones of polysilicon-II transistors to be produced are also opened; after step (i), producing a polysilicon-II layer in a known manner; and executing step (h) after structuring said polysilicon-II layer prior to step (j).

5. A process for producing integrated n-channel and p-channel MOS circuits without MNOS memory transistors in silicon-gate technology and having overlapped contacts using a silicon nitride mask, comprising a sequential combination of steps:

(a) producing structure SiO$_2$ layers on a p- or n-doped semiconductor substrate so as to separate active transistor zones in accordance with the so-called LOCOS or isoplanar process;

(b) depositing a silicon nitride layer over the entire device surface;

(c) executing a channel ion implantation;

(d) etching said silicon nitride layer so as to produce select nitride-covered substrate zones;

(e) executing a gate oxidation step by oxidizing the uncovered n- or p-doped substrate surface and substantially simultaneously oxidizing the surface of said structured silicon nitride layer to form an oxynitride layer;

(f) depositing a n+- or p+-doped polysilicon layer over the entire device surface and structuring the polysilicon layer in a predetermined manner;

(g) executing an ion implantation step so as to produce monocrystalline n+- or p+-doped source and drain zones in said p- or n-doped substrate;

(h) oxidizing said structured polysilicon layer to form an $SiO_2$ layer;

(i) producing a second $SiO_2$ layer (intermediate oxide) onto the entire device surface;

(j) etching contact holes so as to form contacts between n+- or p+-doped zones, polysilicon zones and metallic interconnections, respectively, and (k) producing a select pattern of metallic interconnections.

6. A process as defined in claim 5 wherein said process is executed in a $Si^2$-gate technology and during step (e) gate zones of polysilicon-II transistors to be produced are also opened; after step (i), producing a polysilicon-II layer in a known manner; and executing step (h) after structuring said polysilicon-II layer prior to step (j).

* * * * *